United States Patent
Theeuwen et al.

(10) Patent No.: US 7,521,768 B2
(45) Date of Patent: Apr. 21, 2009

(54) ELECTRIC DEVICE COMPRISING AN LDMOS TRANSISTOR

(75) Inventors: Stephan Jo Cecile Henri Theeuwen, Nijmegen (NL); Freerk Van Rijs, Nijmegen (NL); Petra Christina Anna Hammes, Nijmegen (NL); Ivo Bernhard Pouwel, Nijmegen (NL); Hendrikus Ferdinand Franciscus Jos, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/569,171

(22) PCT Filed: Aug. 24, 2004

(86) PCT No.: PCT/IB2004/051549

§ 371 (c)(1),
(2), (4) Date: Feb. 22, 2006

(87) PCT Pub. No.: WO2005/022645

PCT Pub. Date: Mar. 10, 2005

(65) Prior Publication Data

US 2007/0007591 A1  Jan. 11, 2007

(30) Foreign Application Priority Data

Aug. 27, 2003  (EP) .................... 03103233

(51) Int. Cl.
*H01L 27/088* (2006.01)
*H01L 29/78* (2006.01)
(52) U.S. Cl. ...................... 257/408; 257/409
(58) Field of Classification Search .............. 257/408
See application file for complete search history.

(56) References Cited

U.S. PATENT DOCUMENTS

| 5,514,608 | A  | * | 5/1996 | Williams et al. | 438/286 |
| 6,063,678 | A  | * | 5/2000 | D'Anna          | 438/301 |
| 6,448,611 | B1 | * | 9/2002 | Oh              | 257/340 |
| 6,545,316 | B1 | * | 4/2003 | Baliga          | 257/329 |
| 6,870,219 | B2 | * | 3/2005 | Brech           | 257/340 |
| 2002/0102800 | A1 | * | 8/2002 | Van Den Heuvel | 438/301 |

FOREIGN PATENT DOCUMENTS

EP  0069429 B1 *  1/1983

* cited by examiner

*Primary Examiner*—Jerome Jackson, Jr.
*Assistant Examiner*—Anthony Ho

(57) ABSTRACT

The LDMOS transistor (99) of the invention is provided with a stepped shield structure (50) and/or with a first (25) and a second (26) drain extension region having a higher dopant concentration than the second drain extension region, and being covered by the shield.

7 Claims, 5 Drawing Sheets

ELECTRIC DEVICE COMPRISING AN LDMOS TRANSISTOR

The invention relates to an electronic device comprising a transistor provided at a surface of a semiconductor substrate, the transistor having a source and a drain electrode that are mutually connected through a channel and a gate electrode for influencing an electron distribution in the channel and a shield present between the gate and the drain electrode, which drain electrode is provided with a drain extension extending in the substrate towards the channel, the drain having a contact, said drain contact and said gate being mutually separated through an extension area.

The invention further relates to a method of manufacturing thereof.

In base stations for personal communications systems (GSM, EDGE, W-CDMA), the RF power amplifiers are one of the key components. For these power amplifiers, RF Laterally Diffused Metal Oxide Semiconductor, generally abbreviated as LDMOS, transistors are now the preferred choice of technology [1], because of its excellent high power capabilities, gain and linearity. To be able to meet the demands imposed by new communication standards, the performance of LDMOS transistors is subject to continuous improvements [2]. Especially for W-CDMA systems, the linearity demands are very stringent which can only be met by operating the amplifier sufficiently far in back-off. However, this means that the efficiency decreases to typically ≈30%, and becomes an issue. It is this trade-off between linearity and efficiency that nowadays receives much attention.

It is therefore an object of the present invention to provide an electronic device of the kind described in the opening paragraph with an improved linearity-efficiency trade-off.

This object is achieved in that the shield has a stepped structure in the extension area. The stepped structure combines the advantages of the improved field distribution with a better current capability and on-resistance. The step construction diminishes the pinch action of the shield near the channel giving an improved on-resistance. At the same time, the breakdown voltage is unaltered, as is imposed by the lower part of the stepped shield structure at the side facing away from the gate electrode.

The object is also achieved in that the drain extension is provided with a first and a second region, the first region having interfaces with the channel and the second region, the second region having an interface with a contact area within the drain electrode, wherein the first region has a higher dopant concentration than the second region, and the first region is substantially present within a shield area defined by a perpendicular projection of the shield on the substrate.

In a very suitable embodiment, both measures are combined to provide optimal performance. The combination leads to a total efficiency improvement at linear operation of about 6%.

The measures are particularly suitable for use in so-called LDMOS-transistors on the basis of a silicon substrate. However, they are suitable for other technologies as well. The result is a transistor that can be suitable used for a broad range of frequencies in the RF field, for instance from 800 MHz to 2.4 GHz. It is particularly suitable for use in a power amplifier.

Furthermore, the invention can be implemented in transistors with different channel length and different sizes of the extension area. These are parameters that are suitable for optimization of the device. In a suitable embodiment, use is made of an additional capacitor that can be driven by a separate contact (providing a four-terminal device). In another suitable embodiment, the transistor is provided as an array of parallelly switched transistor segments, each of the segments having a first and a second threshold voltage. These embodiments are per se known from the non-prepublished applications EP03101224.8 (PHNL030460) and EP03101096.0 (PHNL030398), which are included by reference.

These and other aspects of the device of the invention will be further elucidated with reference to the Figures, that are not drawn to scale and purely diagrammatical, in which.

The Figures are not drawn to scale and like reference numbers refer to like parts.

Figure 1:
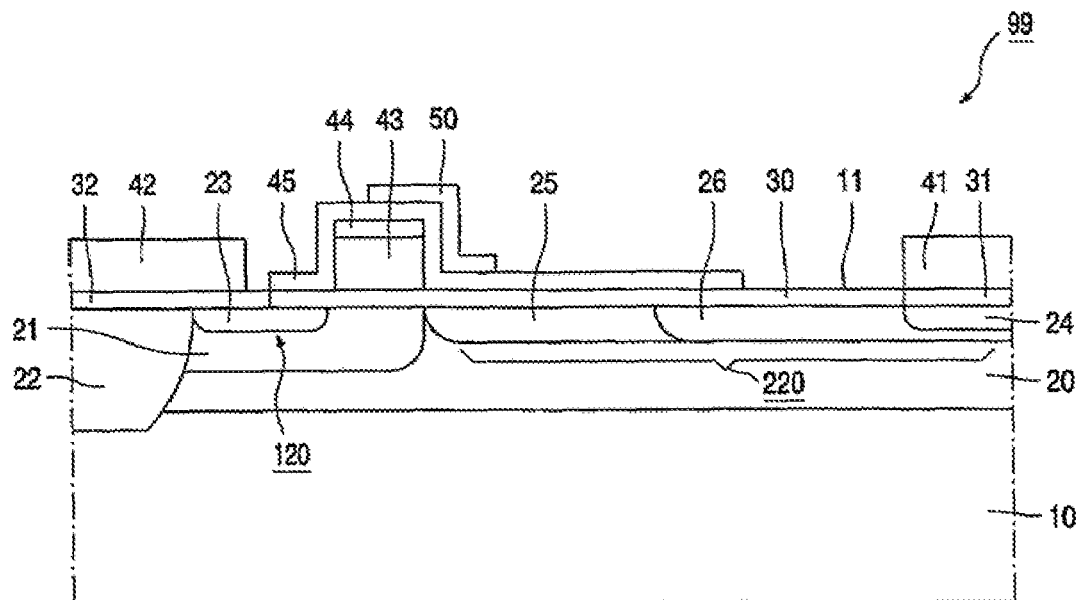
FIG. 1 shows a diagrammatical cross-sectional view of a prior art LDMOS device.

FIG. 1 depicts a cross-sectional view of a conventional, state of the art LDMOS transistor 99. The transistor 99 comprises a substrate 10 of a semiconductor material, in this case, silicon, with a first side 11 and an opposite second side 12. The substrate is highly doped. On the first side 11 an epitaxial layer 20 is present. This is a p-type doped epilayer of silicon, which alternatively could be SiGe, SiC or the like. On top of the epitaxial layer 20 an oxide layer 30 is present. The transistor 99 comprises a source 120, a drain 220 and a gate 43. Between source 120 and drain 220, and in an area to be influenced by the gate 43 a channel 21 is present. This channel 21 is, in this example, a laterally diffused p-well.

In the context of this application, the terms source 120 and drain 220 are understood to cover all elements functioning as part of the source and drain respectively, including contacts and extensions. The source 120 is provided with a source contact 41, a connection 31 and a highly doped contact region 23. Also, a p-sinker 22 is present to connect the source electrode 32 to the highly doped substrate 10. The drain 220 is provided with a drain contact 42, a connection 32, a highly doped contact region 24, and first and second drain extensions 25,26. These drain extensions 25,26 are lowly doped. The first drain extension 25 is extending from the channel 21 to the second drain extension 26. The second drain extension extends to the drain contact region 24. The source contact region 23 and the drain contact region 24 are both N+-doped, in this example. The gate electrode 43 has a silicidated area 44. Separated from the gate 43 by an electrically insulating layer 45 is a shield structure 50.

The design of the drain extensions 25,26 is a field of intensive design. A first option is the use of a single, uniformly doped drain extension. Such a drain extension is optimized for maximum output power. A disadvantage is however that hot carrier degradation will occur which manifests itself by a drift in the quiescent current (Idq) at constant voltage between source 32 and gate 43 ($V_{gs}$).

A second option is a step-wise doping profile as shown in FIG. 1. Such a step-wise doping profile comprises a first and a second lowly doped extension regions 25,26. This option solves the problem of hot carrier degradation, but at the cost of some RF-performance.

A further improvement is the introduction of the dummy gate as shield, which is described in the non-prepublished application EP03101096.0. This gives a better trade-off between the hot carrier degradation, also referred to as $I_{dq}$-degradation, and RF-performance. This shield is not shown in FIG. 1. It is connected to the source 42 (in the 3rd dimension, not shown in FIG. 1) and acts as a field plate near the gate 43. Due to the close proximity of the shield to the gate 43 and drain extension 26, the electric field distribution in the drain extension 25,26 reduces the $I_{dq}$-degradation and improves feedback capacitance. With this improvement Another trade-off now becomes dominant: That between breakdown voltage (BV) versus current capability (Idsx) and on-resistance (Ron).

Figure 2:
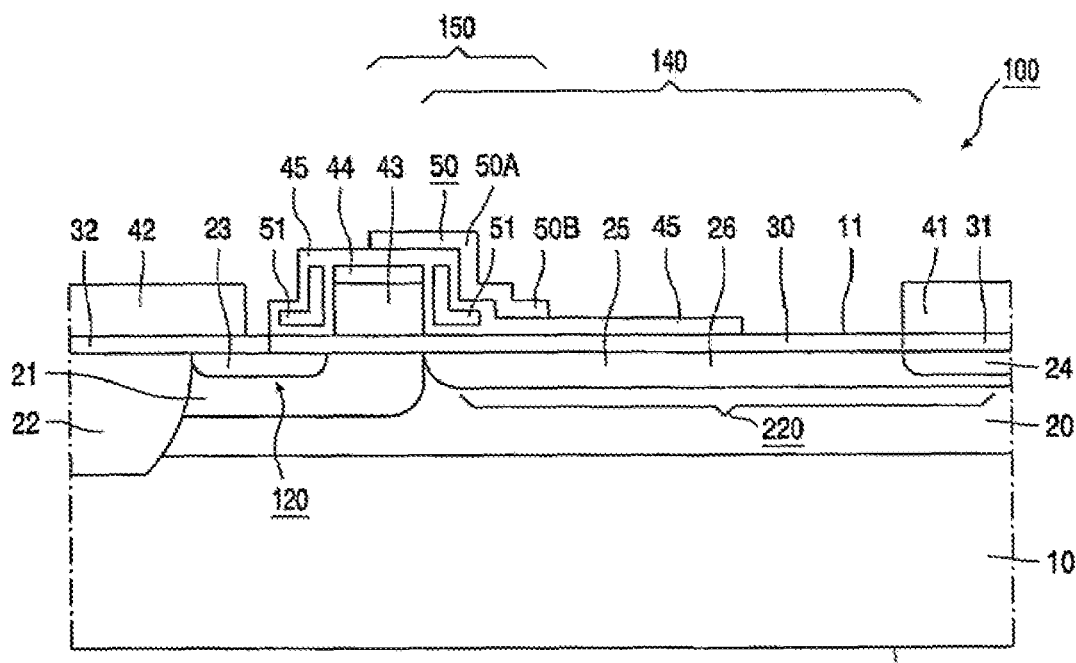
FIG. 2 shows a diagrammatical cross-sectional view of the device of the invention, including both high doping zone and stepped shield.

FIG. 2 shows a diagrammatical cross-sectional view of the device of the invention 100. Herein, two major improvements have been made. The improvements contribute both to the optimal performance. The one improvement relates to the shield structure 50, and the other relates to the design of the drain extensions 25, 26. Although they are preferably applied in combination, it is not excluded that the two improvements are applied separately. This is particularly the case in view of the fact that the present examples relate to transistors suitable for use in basestations. These are designed so as to have a very high breakdown voltage, and a high power and voltage. The same improvements can be applied for instance power amplifiers in mobile phone applications. The requirements regarding linearity and efficiency are therein the same, but the breakdown voltage is lower, whereas the power consumption is very critical. The design can be optimized for the specific application, for instance by varying the doping concentration in the drain extension 25,26. For basestations, such concentration is in the order of $10^{12}$, whereas for mobile phones the concentration is generally higher.

Figure 7:
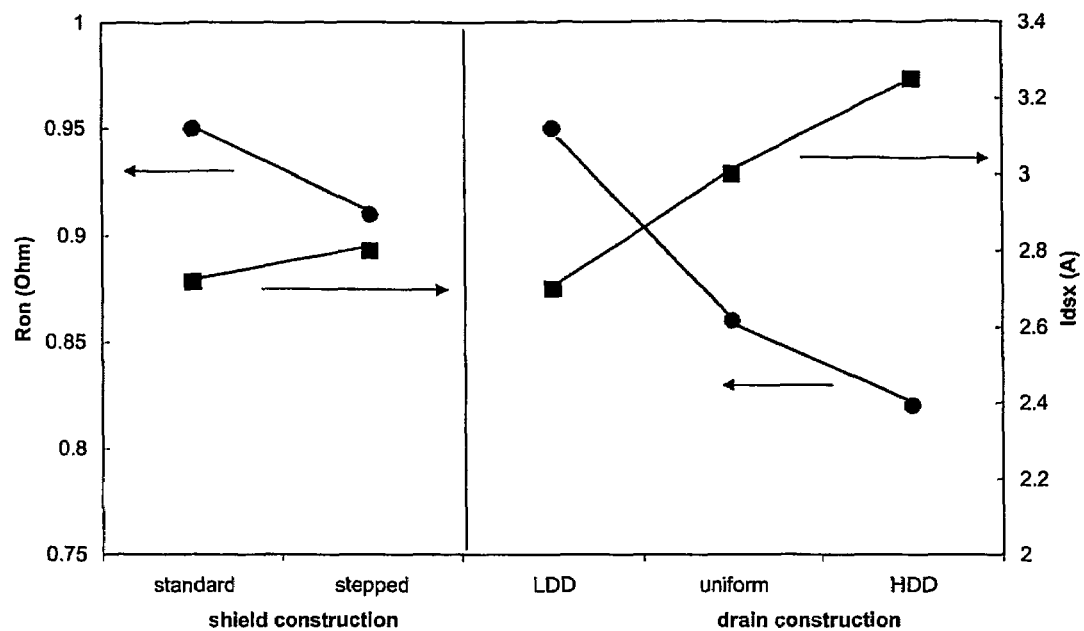
FIG. 7 shows the on-resistance Ron and the current capacity Idsx for the different shield construction and the different drain extension constructions.

The first improvement is the stepped shield structure 50. The stepped structure is provided in an extension area 140 present between the gate 43 and the drain contact 41. Preferably, the stepped structure 50 is present in the vicinity of the gate electrode 43. Most preferably, it is deposited partially on top of the gate electrode 43 and partially adjacent to the gate electrode 43, and separated from it by insulating material 45,51. This structure combines the advantages of the improved field distribution with a better current capability and on-resistance Ron. The step construction diminishes the pinching action of the shield near the channel giving an improved Ron and an improved current capability Idsx (FIG. 7). At the same time, the breakdown voltage is unaltered as imposed by the lower part of the shield on the right hand side in the drawing, e.g. at the side between gate electrode 43 and drain contact 42. The device 100 of the shown embodiment is made in the LDMOS technology in a silicon substrate 10. It is however not excluded that use is made of alternative semiconductor substrates, such as SiGe or even a III-V material substrate, such as GaAs.

As can be seen in FIG. 2, the stepped shield 50 is provided in an advantageous manner by deposition of the shield layer on top of an L-spacer 51, in this case a nitride L-spacer 51. The provision of such an L-spacer 51 is known per se from WO-A 02/049092, that is included herein by reference. The gate 43 of the present device is made of polysilicon with a gate length of 0.6 μm. However, a metal gate may be used alternatively. On top of the oxide/nitride stack of the layers 45 and 51 the shield 50 is formed by depositing either a low resistive metal or silicided poly-silicon layer. The low resistance of the shield 50 leads away the RF current imposed on the shield 50 by the gate 43 and drain 31, resulting in an RF shielding action. The stepped structure has the big advantage that a stepped profile as used in the prior art is no longer needed to keep hot carrier degradation in control. The extension can thus be doped as is desired or preferred, hence uniform, stepped with low dopant profiles or with higher dopant profiles.

The stepped shield structure 50 as shown can be subdivided in two sections: an inversed L-shaped section 50A and a z-shaped section 50B. It is the insight that the z-shaped section 50B is essential for the performance of the device, so as to minimize the parasitic capacity between the source contact 41 and the gate 43, while maintaining or improving the efficiency, at the same or similar breakdown voltage. The reduction of the parasitic capacity is achieved, in that the z-shaped section SOB is located at a larger distance from the source contact 41.

The inversed L-shaped section 50A is present as a consequence of the technology used during the experiments leading to the invention. In this technology, use is made of nitride L-spacers. However, in a further technological development, particularly by using a photoresist that allows a higher resolution, the inversed L-shaped section can be reduced in size, or even be completely absent. This would be advantageous for the reduction of the parasitic capacitance. In a further embodiment, the stepped shield structure 50 is provided with an extension substantially transversal to the substrate surface 11. Such an extension is considered to have a beneficial influence on the shielding function. Instead of the L-shape, the section 50A has in this case an I-shape. The shielding function will be improved particularly, if such I-shaped section 50A protrudes above the gate electrode 43.

Figure 3:
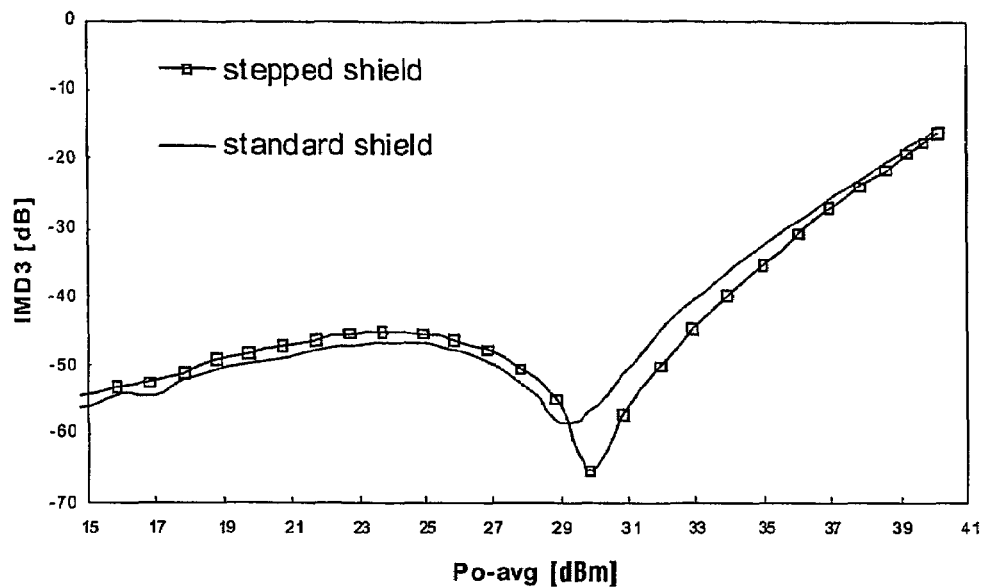
FIG. 3 shows the IMD3 performance of the device provided with a shield in a conventional and a stepped shape.
Figure 4:
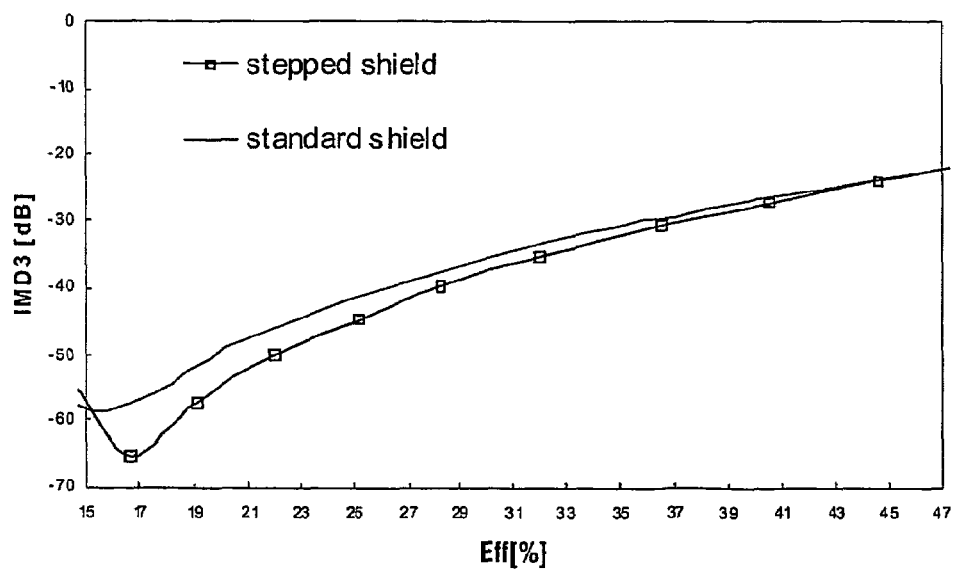
FIG. 4 shows the IMD3 performance versus the efficiency for the device with a shield in a conventional and a stepped shape.

FIGS. 3 and 4 show the two-tone large signal RF-performance of a device having a channel length of 18 nm. This RF performance is shown for a device 100 with a stepped shield and a conventional device 99 with a standard shield. The RF performance is measured in terms of linearity. The linearity is of primary importance for the RF performance, and this linearity is generally measured as the higher (uneven) order intermodulation distortion. Particularly the third order intermodulation distortion is critical, and this is used as the measure. This distortion will also be referred to as IMD3. Further explanation regarding the IMD3 is described in the pending patent applications EP03101224.8 (PHNL030460) and EP03101096.0 (PHNL030398), which are included by reference.

In FIG. 3, the IMD3 is shown as a function of the average output power Po-avg in dBm.

In FIG. 4, the IMD3 is shown as a function of the efficiency of the device. At linear operation, at −40 dBc IMD3, both the output power increases and the linearity-efficiency trade-off improves for the stepped shield. −40 dBc is currently accepted as an acceptable level for the IMD3 for application in basestations. FIG. 3 shows that the device of the invention leads to an improvement of 1 dBm (=26%) power. FIG. 4 shows that the device of the invention leads to an improvement of efficiency of 2%.

The second major improvement of the invention resides in the use of a heavily doped drain region 25 in combination with a low doped drain region 26. The heavily doped region 25 is the first region, i.e. the region that is located nearest to the gate electrode 43. This heavily doped drain region 25 will also be referred to as HDD. The lowly doped drain region 26 is the second region that is located nearer to the drain electrode 31, and will also be referred to as LDD. The notion 'heavy' must be regarded in comparison to 'low'. Preferably, the ratio between heavy and low is between 1,2 and 3, by further preference between 1,3 and 2,5 and most preferred in the range of 1,5 and 2. The higher limitation is due in order to realize a sufficient breakdown voltage. For some applications, this is less critical. The use of a high and low doped drain region 25,26 is preferably combined with the measure that the HDD 25 extends laterally within the area covered by the shield 50. However, the use of a HDD 25 next to a LDD 26 turns out to have a beneficial effect even if no shield 50 would be present at all—which is however unlikely for RF applications. Preferably, the HDD 25 is even somewhat smaller than the area covered by the shield 50.

Figure 5:
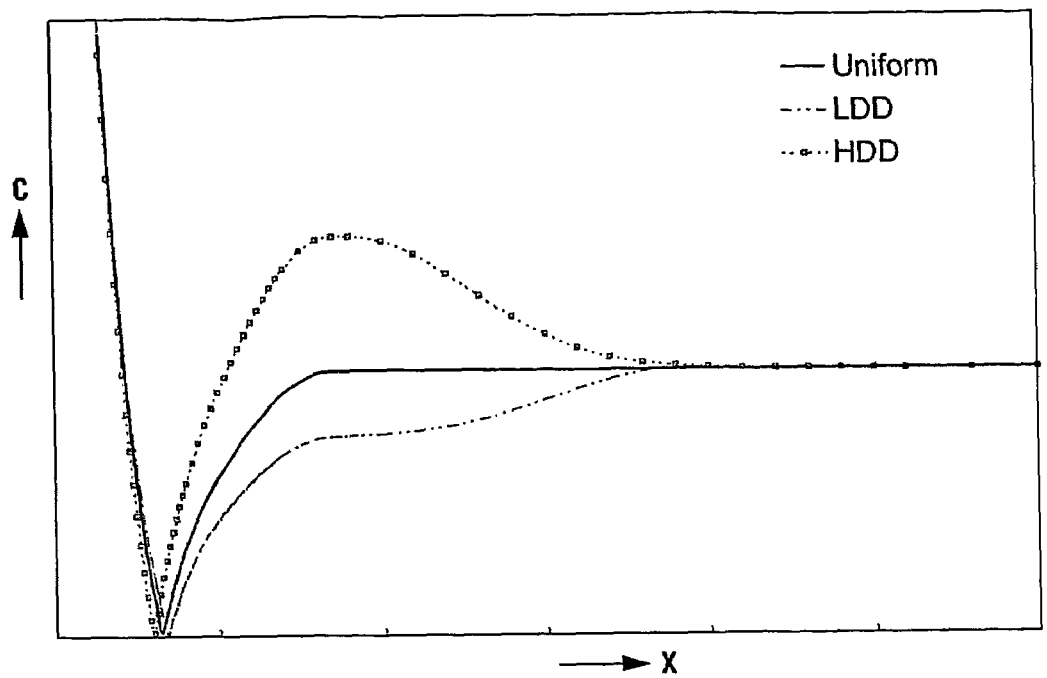
FIG. 5 shows doping profiles along the surface of a uniform drain extension, a prior art device as shown in FIG. 1 and the device of the invention as depicted in FIG. 2.

To examine the effect of LDD or HDD, devices were processed with three different doping profiles: a uniform drain extension, an LDD and HDD profile. These profiles are shown in FIG. 5. The doping profile is expressed as a doping concentration c as a function of the distance x. This distance x is defined as the lateral position along the surface 11 of the substrate 10, wherein x=0 defines the left side of the source 120. The doping profiles are more gradual than as shown in the diagrammatical cross-sectional view of FIG. 2. This is a result of outdiffusion.

Figure 6:
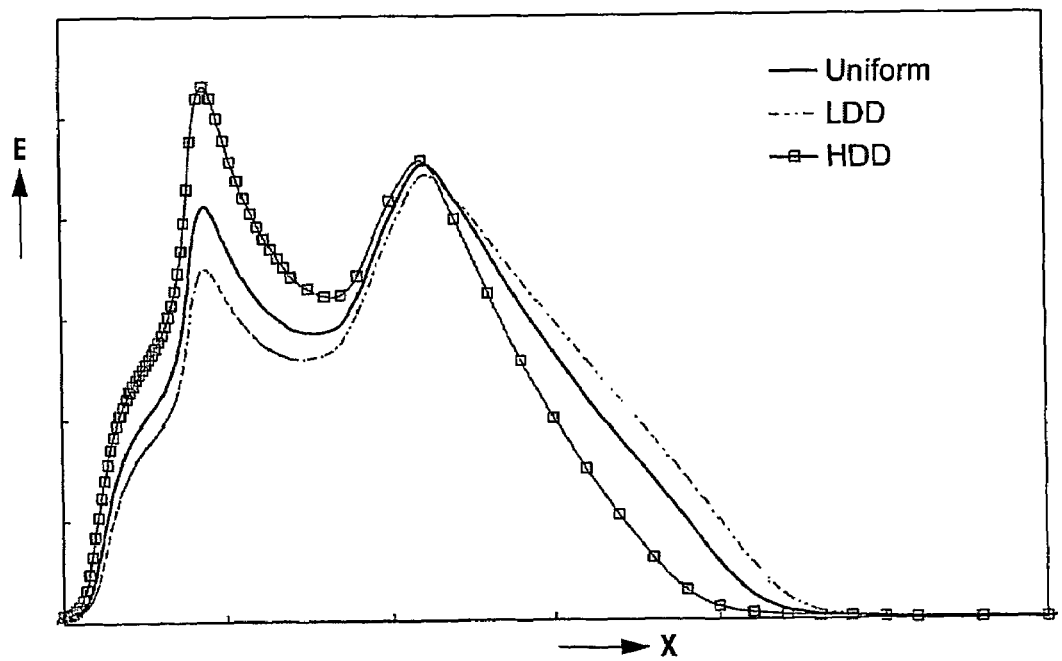
FIG. 6 shows the electric field distribution at 26V along the surface in the drain extension region for the doping profiles of FIG. 5.

In FIG. 6, the electric field E is set out as a function of said lateral position x for each of the doping profiles. Usually a higher dope means also a lower breakdown voltage. When, however, the HDD region 25 is restricted to the area below the shield 50, the peak electric field in the remaining drain extension 26 does not change, see FIG. 6, and the breakdown voltage remains unaltered.

FIG. 7 shows the influence of the shield construction on the on-resistance (Ron). It further shows the influence of the drain construction on the current capability (Idsx). The higher dope concentration in the HDD region 25 has, however, a large impact on Ron and current capacity Idsx. Both improve significantly with the use of an HDD 25.

The lines indicated by the arrow to the left side demonstrate the on-resistance Ron. The lines indicated by the arrow the right side demonstrate the value of the current capability Idsx. The slopes of both lines are opposite, as Ron is reversely proportional to Idsx. The Figure demonstrates that the modification from LDD to uniform to HDD results in a decrease of Ron and an increase of Idsx. This is an advantageous effect. The same effect occurs for the modification from the standard to the stepped shield structure.

Figure 8:
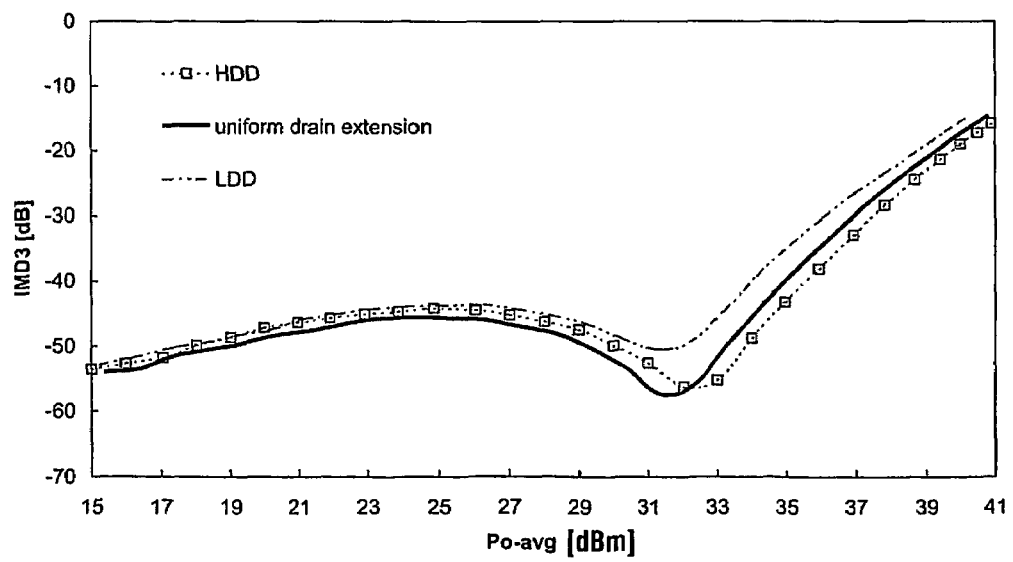
FIG. 8 shows the IMD3 performance of the device provided with a uniform drain extension, with an LDD and with a HDD.
Figure 9:
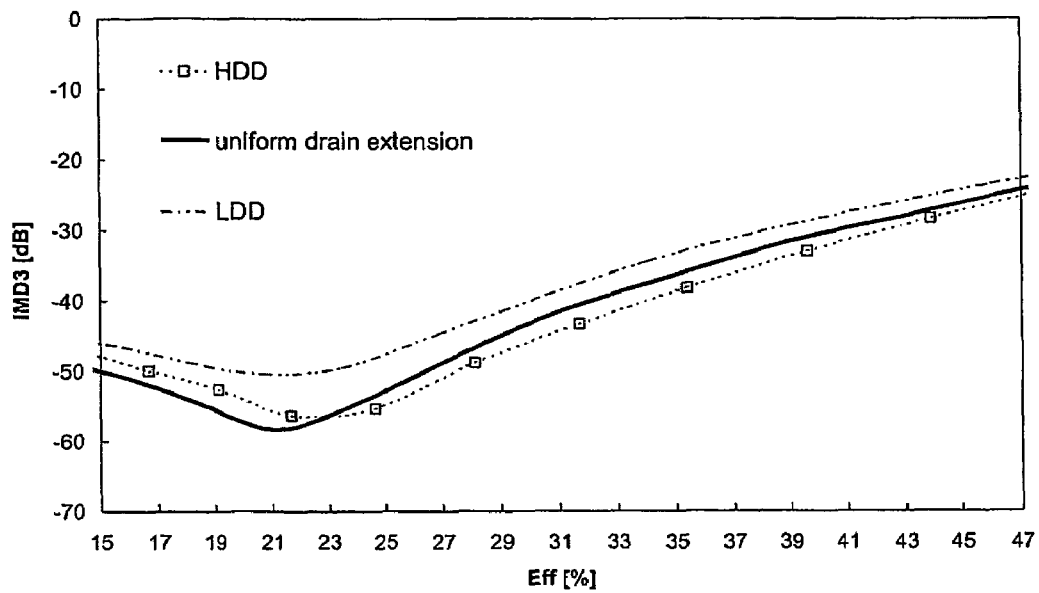
FIG. 9 shows the IMD3 versus the efficiency of the device with uniform drain extension, with an LDD and with a HDD.
Figure 10:
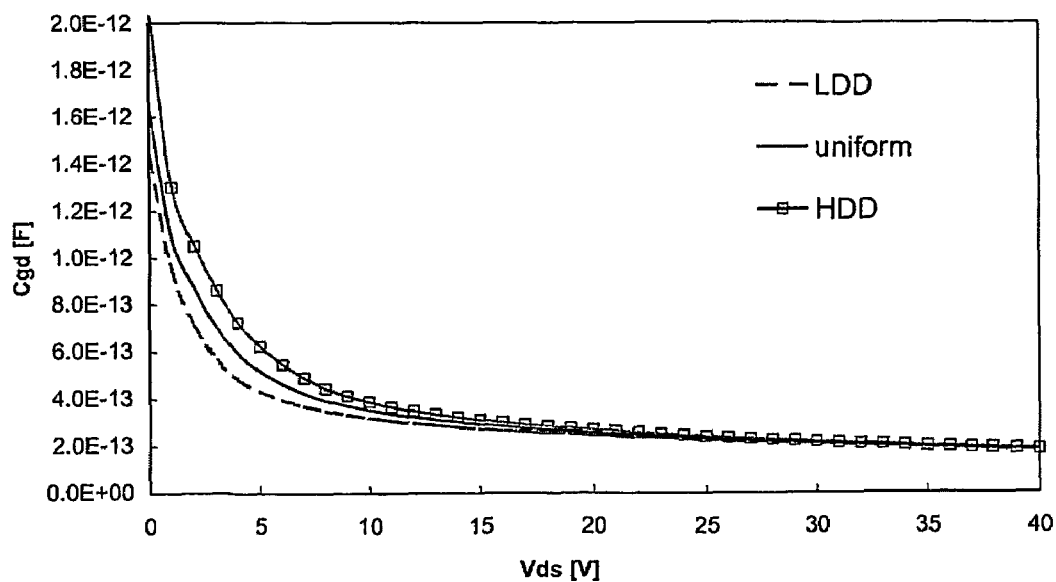
FIG. 10 shows the feedback capacitance Cgd for the device with uniform drain extension, with an LDD and with an HDD.

FIGS. 8 and 9 show the two-tone large signal RF-performance. The IMD3 is herein the relevant parameter, as in FIGS. 3 and 4, and is set out against the average output power Po-avg and the efficiency, respectively. At linear operation, at around −40 dBc IMD3, the output power again increases and also the linearity-efficiency trade-off improves with HDD. With the higher dope the feedback capacitance increases, but this is limited to lower voltages. As the first drain extension (HDD) is more highly doped than a conventional drain extension, the first drain extension depletes less rapidly at an increase of the voltage between source and drain Vds. Consequently, the decrease of the capacitance between gate and drain Cgd is slower in the beginning. However, when the complete HDD is depleted, the drain extension will behave as a uniformly doped drain extension.

The invention claimed is:

1. An electronic device comprising a transistor provided at a surface of a semiconductor substrate, the transistor having a source and a drain that are mutually connected through a channel, which transistor is further provided with a gate electrode for influencing an electron distribution in the channel and with a shield present between the gate and the drain, which drain is provided with a drain extension extending in the substrate towards the channel, the drain having a contact, said drain contact and said gate being mutually separated through an extension area, wherein the shield has a stepped structure in the extension area, the shield including an inverse L-shaped section and a z-shaped section, a top end of the z-shaped section being connected to a bottom end of the inverse L-shaped section.

2. An electronic device as claimed in claim 1, wherein a L-shaped spacer is present between the gate-electrode and the shield.

3. An electronic device as claimed in claim 1, wherein the shield is formed as a metal silicide.

4. An electronic device as claimed in claim 1, wherein the drain extension is provided with a first and a second region, the first region having interfaces with the channel and the second region, the second region having an interface with a contact area within the drain, which first region has a higher dopant concentration than the second region, and wherein the first region is present within a shield area defined by a perpendicular projection of the shield on the substrate.

5. An electronic device as claimed in claim 4, wherein the interface between the first and the second region is present within the shield area.

6. An electronic device as claimed in claim 4, wherein a ratio of the dopant concentrations in the first and the second region is in the range of 1.2 to 2.5.

7. An electronic device as claimed in claim 1, wherein the semiconductor substrate is made of silicon and the transistor is of the LDMOS type.

* * * * *